(12) United States Patent
Kwon

(10) Patent No.: US 10,196,732 B2
(45) Date of Patent: Feb. 5, 2019

(54) MASK ASSEMBLY FOR THIN FILM DEPOSITION THAT INCLUDES A PARTIALLY ETCHED AREA AND METHOD OF MANUFACTURING THE MASK ASSEMBLY

(71) Applicant: SAMSUNG DISPLAY CO., LTD., Yongin, Gyeonggi-Do (KR)

(72) Inventor: Ohseob Kwon, Yongin (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 111 days.

(21) Appl. No.: 14/798,735

(22) Filed: Jul. 14, 2015

(65) Prior Publication Data

US 2016/0144393 A1    May 26, 2016

(30) Foreign Application Priority Data

Nov. 24, 2014 (KR) .......................... 10-2014-0164424

(51) Int. Cl.
*B05C 21/00* (2006.01)
*C23C 14/04* (2006.01)
*C23C 16/04* (2006.01)
*H01L 51/00* (2006.01)
*G03F 7/40* (2006.01)

(52) U.S. Cl.
CPC .......... *C23C 14/042* (2013.01); *C23C 16/042* (2013.01); *G03F 7/40* (2013.01); *H01L 51/00* (2013.01); *B05C 21/005* (2013.01); *H01L 51/0011* (2013.01)

(58) Field of Classification Search
CPC ....... B05B 15/04; B05B 12/20; C23C 14/042; C23C 16/042; H01L 51/0011
USPC ......................................................... 118/504
See application file for complete search history.

(56) References Cited

U.S. PATENT DOCUMENTS

| | | | |
|---|---|---|---|
| 7,572,338 B2* | 8/2009 | Kim ...................... | C23C 14/042 118/504 |
| 2001/0019807 A1 | 9/2001 | Yamada et al. | |
| 2006/0103289 A1* | 5/2006 | Kim ...................... | C23C 14/042 313/402 |
| 2011/0229633 A1* | 9/2011 | Hong .................. | H01L 51/0011 427/162 |
| 2012/0266813 A1 | 10/2012 | Hong | |
| 2014/0150721 A1* | 6/2014 | Oh ........................ | C23C 14/042 118/504 |

(Continued)

FOREIGN PATENT DOCUMENTS

| | | |
|---|---|---|
| JP | 11-229117 A | 8/1999 |
| JP | 2000-054168 A | 2/2000 |

(Continued)

*Primary Examiner* — Karl Kurple
(74) *Attorney, Agent, or Firm* — Lee & Morse, P.C.

(57) ABSTRACT

A mask assembly for thin film deposition, the mask assembly, including a mask frame having an opening; a mask coupled to the mask frame and having a first surface facing a substrate and a second surface opposite to the first surface, a plurality of deposition pattern portions, and a rib between the adjacent deposition pattern portions, the mask having a partially etched area, the plurality of deposition pattern portions being within the partially etched area; and a partial etching extension portion in an outer portion of an area corresponding to the plurality of deposition pattern portions.

11 Claims, 12 Drawing Sheets

(56) References Cited

U.S. PATENT DOCUMENTS

2016/0343945 A1* 11/2016 Kim .................. C23C 14/042

FOREIGN PATENT DOCUMENTS

| | | |
|---|---|---|
| JP | 2000-202981 A | 7/2000 |
| JP | 2001-237071 A | 8/2001 |
| KR | 10-2001-0062654 A | 7/2001 |
| KR | 10-2008-0000432 A | 1/2008 |
| KR | 10-2012-0120703 A | 11/2012 |

* cited by examiner ated pattern portions in pposite directions to each other.
MASK ASSEMBLY FOR THIN FILM DEPOSITION THAT INCLUDES A PARTIALLY ETCHED AREA AND METHOD OF MANUFACTURING THE MASK ASSEMBLY

CROSS-REFERENCE TO RELATED APPLICATION

Korean Patent Application No. 10-2014-0164424, filed on Nov. 24, 2014, in the Korean Intellectual Property Office, and entitled: "Mask Assembly For Thin Film Deposition and Method Of Manufacturing The Mask Assembly," is incorporated by reference herein in its entirety.

BACKGROUND

1. Field

One or more exemplary embodiments relate to mask assemblies for thin film deposition and methods of manufacturing the mask assemblies.

2. Description of the Related Art

An organic light emitting display apparatus including a thin film transistor (TFT) may be used in mobile devices such as smartphones, tablet personal computers, laptop computers, digital cameras, camcorders, or portable information terminals, or electronic devices such as super-slim TVs or signboards.

SUMMARY

Embodiments may be realized by providing a mask assembly for thin film deposition, the mask assembly, including a mask frame having an opening; a mask coupled to the mask frame and having a first surface facing a substrate and a second surface opposite to the first surface, a plurality of deposition pattern portions, and a rib between adjacent deposition pattern portions, the mask having a partially etched area, the plurality of deposition pattern portions being within the partially etched area; and a partial etching extension portion in an outer portion of an area corresponding to the plurality of deposition pattern portions.

The deposition pattern portions may include a plurality of slits that pass through the mask in a thickness direction of the mask.

The partial etching extension portion may only be in an area of the mask etched without passing through the mask.

The deposition pattern portions may be spaced apart from one another in a length direction of the mask, and the partially etched area may extend from a first end to a second end opposite to the first end in the length direction of the mask.

The partial etching extension portion may extend from the outer portion of the area corresponding to the plurality of deposition pattern portions to an edge of the partially etched area.

The deposition pattern portions may be spaced apart from one another in a length direction of the mask, and the partially etched area may independently be formed for each area corresponding to the deposition pattern portions.

The partial etching extension portion may extend from each outer portion of the area corresponding to the deposition pattern portions to an edge of each of the partially etched areas.

The rib between the adjacent deposition pattern portions may connect the adjacent deposition pattern portions, and the rib may be between partial etching extension portions that extend from adjacent deposition pattern portions in opposite directions to each other.

The rib may be thicker than the partial etching extension portion.

The partially etched area may be an area formed by etching the mask from the second surface to the first surface of the mask so that a portion of the mask has a smaller thickness than other portions of the mask.

The first surface may contact a substrate for deposition, to be patterned.

The mask may be at least one division mask.

Embodiments may be realized by providing a method of manufacturing a mask assembly for thin film deposition, the method including preparing a mask having a first surface facing a substrate and a second surface opposite to the first surface; forming a partially etched area in the mask; forming a plurality of deposition pattern portions in the partially etched area; and forming a partial etching extension portion in an outer portion of an area corresponding to the plurality of deposition pattern portions.

Forming the partially etched area may include coating at least the first surface of the mask with a first photosensitive layer and exposing the first photosensitive layer to light and developing and etching the first photosensitive layer.

Forming the partial etching extension portion may include etching the mask from the outer portion of the area corresponding to the plurality of deposition pattern portions to an edge of the partially etched area without passing through the mask.

The partially etched area may extend from a first end to a second end opposite to the first end in a length direction of the mask, and the deposition pattern portions may be spaced apart from one another in the length direction of the mask.

The partially etched area may independently be formed for each area where the deposition pattern portions are formed, and the plurality of deposition pattern portions may be formed in each of a plurality of partially etched areas.

The deposition pattern portions may be formed by coating at least the second surface of the mask with a second photosensitive layer, exposing the second photosensitive layer to light and developing the second photosensitive layer, and formed as slits that pass through the mask in a thickness direction of the mask by performing at least one etching operation.

The second photosensitive layer may be patterned both on the first surface and the second surface of the mask, and the deposition pattern portions may be formed by performing a two-step etching operation on the first surface and the second surface of the mask.

The second photosensitive layer may be patterned on one of the first surface and the second surface of the mask, and the deposition pattern portions may be formed by performing a one-step etching operation on the one of the first and second surfaces of the mask.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
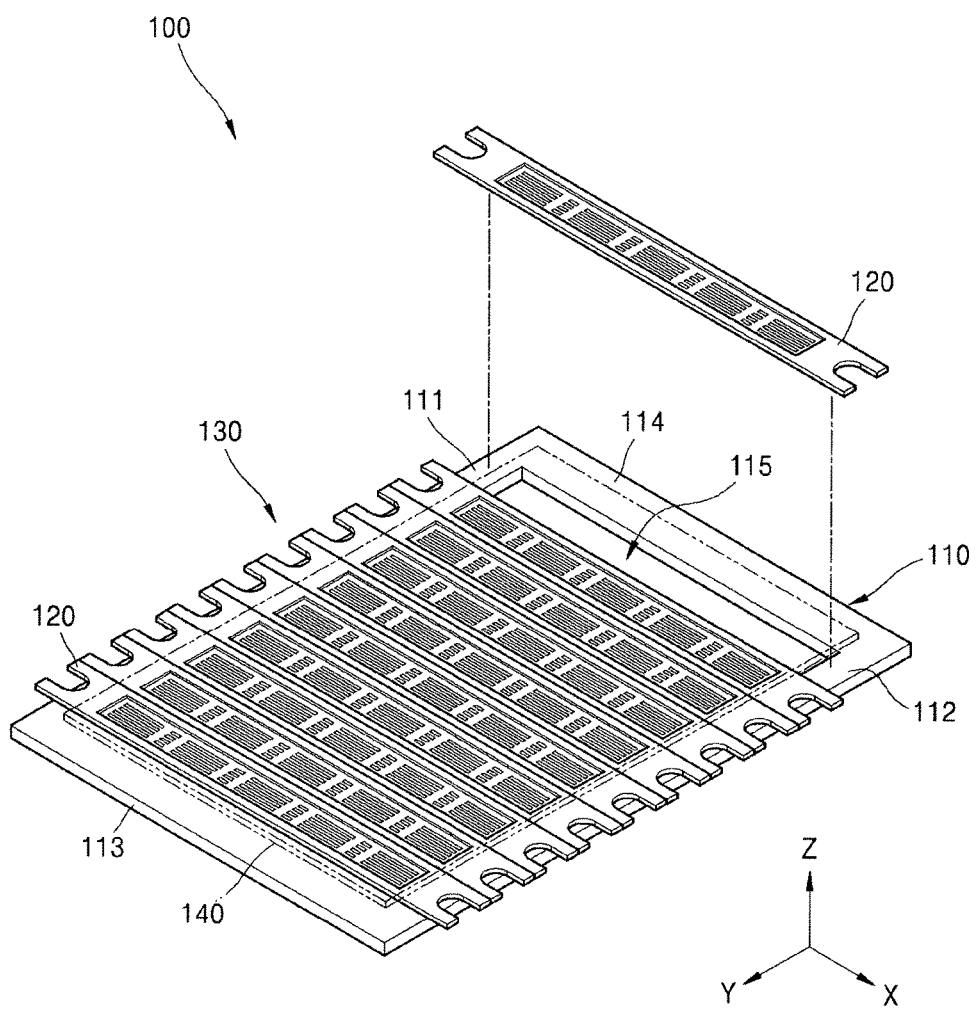
FIG. 1 illustrates a perspective view of a mask assembly for thin film deposition, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc., may be used herein to describe various components, these components should not be limited by these terms. These components are only used to distinguish one component from another.

The terms used in the present specification are merely used to describe particular embodiments, and are not intended to limit the disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

One or more embodiments will be described below in more detail with reference to the accompanying drawings. Those components that are the same or are in correspondence are rendered the same reference numeral regardless of the figure number, and redundant explanations are omitted.

FIG. 1 illustrates a perspective view of a mask assembly 100 for thin film deposition, according to an embodiment.

Referring to FIG. 1, the mask assembly 100 may include a mask frame 110 and a mask 130 having a plurality of division masks 120.

The mask frame 110 may have an opening 115 and may include a plurality of frames 111 through 114 surrounding the opening 115. The plurality of frames 111 through 114 may be connected to one another.

The mask frame 110 may include a first frame 111 and a second frame 112 that face each other in an X direction and extend in a Y direction and a third frame 113 and a fourth frame 114 that face each other in the Y direction and extend in the X direction. The first frame 111, the second frame 112, the third frame 113, and the fourth frame 114 may be connected to one another to form a rectangular frame. The mask frame 110 may be formed of a material that deforms little by welding of the mask 130, for example, of a metal having a high rigidity.

The mask 130 may be mounted on the mask frame 110. In order to form a precise deposition pattern, adhesive properties between the mask 130 and a substrate 140 installed on the mask 130 may be increased, and shadows may be reduced. The mask 130 may be manufactured by using a thin sheet. The mask 130 may be formed of a material such as stainless steel, invar, nickel (Ni), cobalt (Co), a nickel alloy, or a nickel-cobalt alloy.

The mask 130 may include a plurality of division masks 120 that are separate from one another in the Y direction, and sagging thereof, for example, due to their own weight, may be prevented. The division masks 120 may be sticks. According to an embodiment, the mask 130 may have a structure in which, for example, the width of the mask 130 may be smaller than a length thereof, which may be a tensile direction.

The division masks 120 may be separated from one another in a direction (Y direction) across the tensile direction (X direction). For example, the plurality of division masks 120 may be continuously arranged between the third frame 113 and the fourth frame 114, and two ends of each of the division masks 120 may be respectively fixed to the first frame 111 and the second frame 112 by welding. The plurality of division masks 120 may cover the opening 115.

Figure 2A:
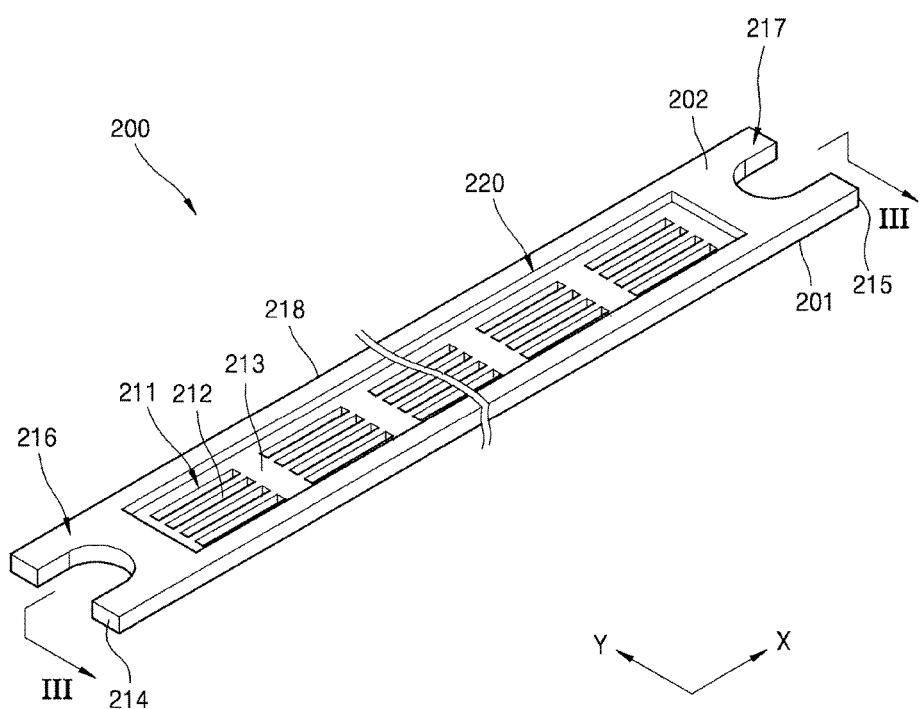
FIG. 2A illustrates a perspective view of a division mask according to an embodiment.
Figure 2B:
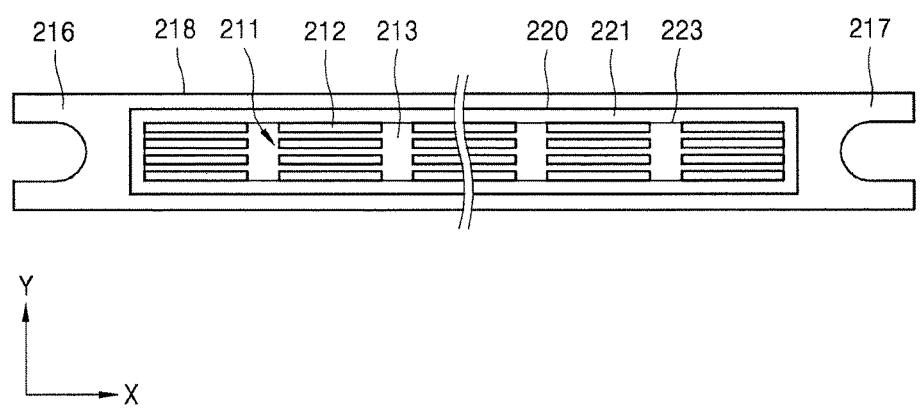
FIG. 2B illustrates a plan view of the division mask of FIG. 2A.

FIG. 2A illustrates a perspective view of a division mask 200 according to an embodiment, and FIG. 2B illustrates a plan view of the division mask 200 of FIG. 2A.

Referring to FIGS. 2A and 2B, the division mask 200 may be a thin metal plate. The division mask 200 may have a first surface 201 facing the substrate 140 (see FIG. 1) and a second surface 202 opposite to the first surface 201. A plurality of deposition pattern portions 211 may be formed in the division mask 200. The deposition pattern portions 211 may be spaced apart from one another in a length direction of the division mask 200 (X direction).

Each of the deposition pattern portions 211 may include a plurality of slits 212. The slits 212 may pass through the division mask 200 in a thickness direction of the division mask 200, e.g., may pass through an entirety of the thickness of the division mask 200. According to the present embodiment, the slits 212 are strip-shaped. In an embodiment, the slits 212 may be, for example, dotted patterns.

According to an embodiment, each of the deposition pattern portions 211 may correspond to a unit display apparatus such as a compact mobile device. In an embodiment, a plurality of division masks 200 may correspond to one large-sized display apparatus.

A rib 213 may be formed between the adjacent deposition pattern portions 211. The rib 213 may connect adjacent deposition pattern portions 211 along the length direction of the division mask 200 (X direction). A dummy deposition pattern portion (not shown) may be further formed in the rib 213. The dummy deposition pattern portion may include a slit or may be a partially etched area, e.g., a half-etched area. Throughout the specification, the phrase "half-etched area" may refer to an embodiment of a "partially etched area".

A half-etched area 220 may be formed in the division mask 200.

The half-etched area 220 may be an area formed by etching the division mask 200 in a thickness direction of the division mask 200 to a predetermined depth, e.g., a depth of half the thickness of the division mask 200. According to an embodiment, the half-etched area 220 may be formed by etching the division mask 200 by a thickness, e.g., a half thickness, of the division mask 200. The half-etched area 220 may not pass through the division mask 200.

The half-etched area 220 may extend from a first end 214 of the division mask 200 to a second end 215 opposite to the first end 214 in a length direction of the division mask 200. The plurality of deposition pattern portions 211 and a plurality of ribs 213 may be disposed within the half-etched area 20. A first area 216 between the half-etched area 220 and the first end 214 and a second area 217 between the half-etched area 220 and the second end 215 may be welded areas. The first area 216 and the second area 217 may not be half-etched.

A partial etching extension portion 221, e.g., a half etching extension portion 221, may be formed in the half-etched area 220. Throughout the specification, the phrase "half etching extension portion" may refer to an embodiment of a "partial etching extension portion".

For example, the half etching extension portion 221 may extend from an outer portion of an area 223 where the plurality of deposition pattern portions 211 are formed, e.g., an outer portion of an area 223 corresponding to the plurality of deposition pattern portions 211, to an edge of the half-etched area 220. The half etching extension portion 221 may be an area formed by etching the division mask 200 in a thickness direction of the division mask 200. Unlike the deposition pattern portions 211, slits passing through the division mask 200 may not be formed in the half etching extension portion 221.

In a width direction of the division mask 200 (Y direction), a portion between the half etching extension portion 221 and an edge 218 of the division mask 200 may not be half-etched.

A pattern of the deposition pattern portions 211 may be formed by using a photosensitive layer.

If the half-etched area 220 is formed in the division mask 200, a photosensitive layer may not be properly attached to the edge of the half-etched area 220. The photosensitive layer may not be properly attached, for example, due to a step between a portion of the division mask 200 that may not be half-etched and the half-etching area 220. If an etching solution penetrates into the area 223 where the deposition pattern portions 211 are formed, through space where no photosensitive layer is attached, pattern defects may be caused.

According to the present embodiment, the half etching extension portion 221 may be formed in the area where the deposition pattern portions 211 are formed, and pattern defects may be prevented.

Figure 3:
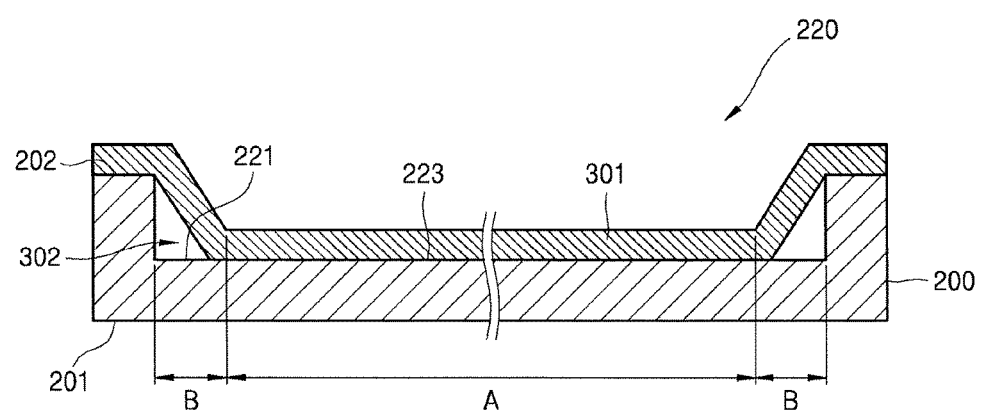
FIG. 3 illustrates a cross-sectional view of a photosensitive layer formed on the division mask of FIG. 2A.

FIG. 3 illustrates a cross-sectional view of a photosensitive layer formed on the division mask 200 of FIG. 2A.

Referring to FIG. 3, the division mask 200 may have a first surface 201 and a second surface 202 that is opposite to the first surface 201. The first surface 201 may contact a substrate for deposition, e.g., a substrate to be deposited upon, to be patterned.

A half-etched area 220 may be formed in the division mask 200. The half-etched area 220 may be an area formed by etching the division mask 200 from the second surface 202 to the first surface 201, and a portion of the division mask 200 may have a smaller thickness than other portions thereof.

A half etching extension portion 221 may be formed in the half-etched area 220. The half etching extension portion 221 may extend from an outer portion of an area A where a plurality of deposition pattern portions are formed to an edge B of the half-etched area 220. The area A may correspond to the area 223 where the plurality of deposition pattern portions 211 are spaced apart from one another at predetermined distances.

A photosensitive layer 301 may be formed on the second surface 202 of the division mask 200. The photosensitive layer 301 may be used to form the deposition pattern portions 211 (see FIG. 2A). The photosensitive layer 301 may be a dry film resist (DFR). According to an embodiment, the photosensitive layer 301 may be a liquid photoresist.

When attaching the photosensitive layer 301 to the second surface 202 of the division mask 200, space 302 where the photosensitive layer 301 may be not attached may be formed at an edge of the half-etched area 220.

According to the present embodiment, the half etching extension portion 221 may be formed outside the area A where deposition pattern portions are formed. The half etching extension portion 221 may correspond to the edge B of the half-etched area 220. The space 302 may be formed in the half etching extension portion 221. As the half etching extension portion 221 is formed, no space may be formed in the area A where a plurality of deposition pattern portions are formed.

As described above, as the half etching extension portion 221 is formed at the edge B of the half-etched area 220, the half-etched area 220 may extends over the area A where a plurality of deposition pattern portions are formed. In the area A where a plurality of deposition pattern portions are formed, the photosensitive layer 301 may completely contact the second surface 202 of the division mask 200. Accordingly, an etching solution may not be able to penetrate into the area A where a plurality of deposition pattern portions are formed, and the deposition pattern portions may be precisely formed.

FIGS. 4A through 4J sequentially illustrate a method of manufacturing a mask 400 according to an embodiment.

Figure 4A:
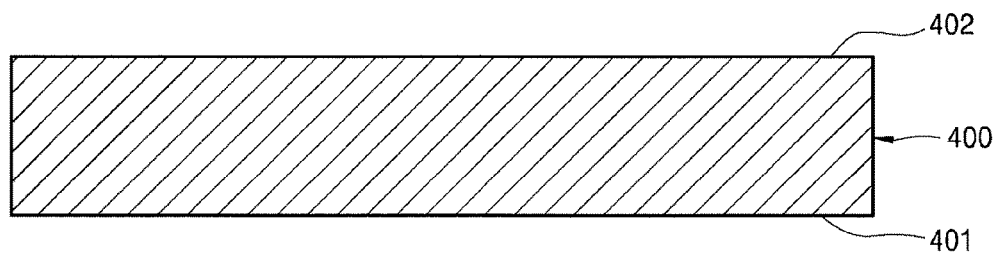
FIGS. 4A through 4J sequentially illustrate a method of manufacturing a mask according to an embodiment.

Referring to FIG. 4A, the mask 400 may be prepared. According to an embodiment, the mask 400 may be a division mask. The mask 400 may include a first surface 401 facing a substrate to be deposited, e.g., to be deposited upon, and a second surface 402 opposite to the first surface 401.

Figure 4B:
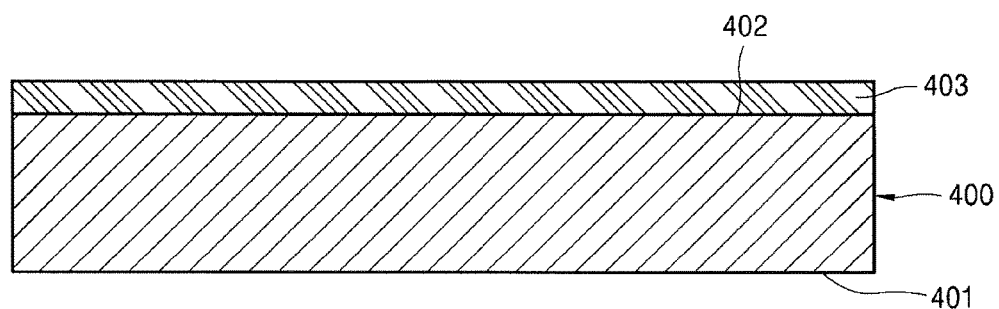

Referring to FIG. 4B, a first photosensitive layer 403 may be formed on the second surface 402 of the mask 400. According to the present embodiment, the photosensitive layer 403 may be a dry film register (DFR). The photosensitive layer 403 may be attached to the second surface 402 of the mask 400 by using a laminating process.

Figure 4C:
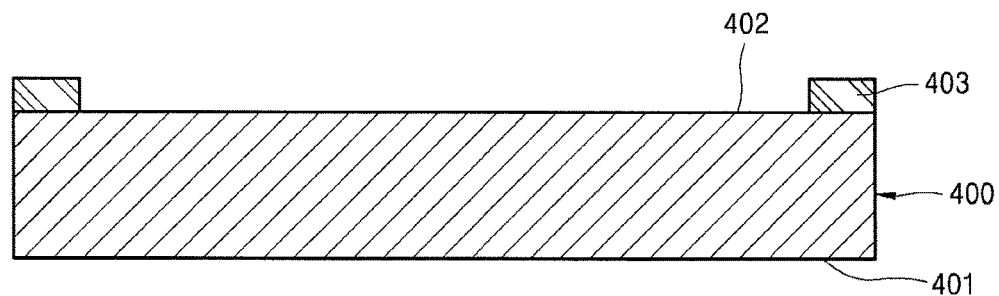

Referring to FIG. 4C, the photosensitive layer 403 may be exposed to light and developed. Then, the photosensitive layer 403 may be etched.

Figure 4D:
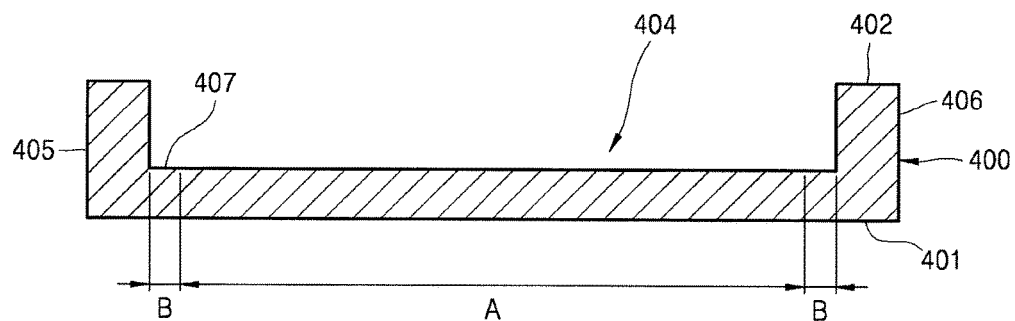

Referring to FIG. 4D, by etching the photosensitive layer 403, a half-etched area 404 may be formed in the mask 400. The half-etched area 404 may be an area formed by etching the mask 400 by a thickness, e.g., half of a thickness, of the mask 400 in a thickness direction of the mask 400. The half-etched area 404 may be formed at a predetermined depth from the second surface 402 of the mask 400, e.g., a depth of half the thickness of the mask 400. The half-etched area 404 may be formed between a first end 405 and a second end 406 of the mask 400 in a length direction of the mask 400. The half-etched area 404 may include an area A where a plurality of deposition pattern portions are formed. During an etching process, a plurality of deposition pattern portions may be spaced apart from one another at predetermined distances in the area A.

A half etching extension portion 407 may be formed in the half-etched area 404. The half etching extension portion 407 may extend from an outer portion of the area A where a plurality of deposition pattern portions are formed to an edge B of the half-etched area 404. The half etching extension portion 407 may correspond to the edge B of the half-etched area 404. The half etching extension portion 407 may be an area that may be etched without passing through the mask 400.

Figure 4E:
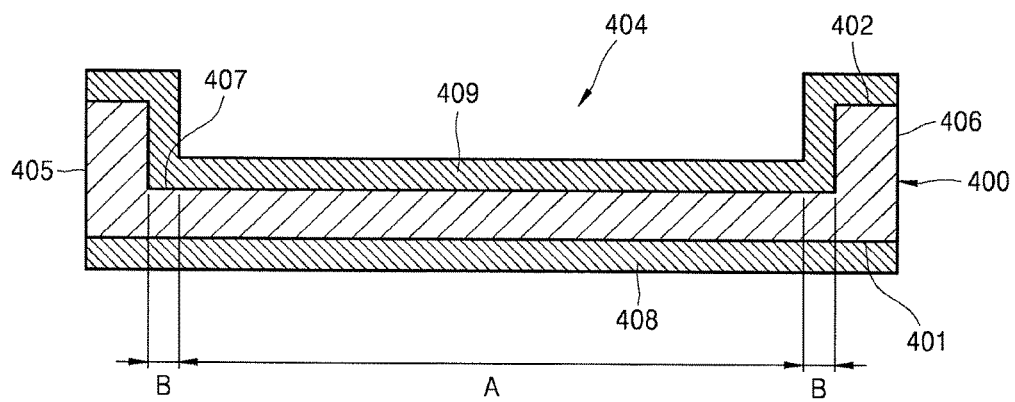

Referring to FIG. 4E, a first photosensitive layer 408 may be formed on the first surface 401 of the mask 400. A second photosensitive layer 409 may be formed on the second surface 420 of the mask 400. According to the present embodiment, the first photosensitive layer 408 and the second photosensitive layer 409 may be dry film registers.

The first photosensitive layer 408 and the second photosensitive layer 409 may be respectively attached to the first surface 401 and the second surface 402 of the mask 400 by using a vacuum lamination process. The first photosensitive layer 408 may be attached to the entire first surface 401 of the mask 400. The second photosensitive layer 409 may cover both the area A where deposition pattern portions of the mask 400 are formed and the edge B of the mask 400.

Figure 4F:
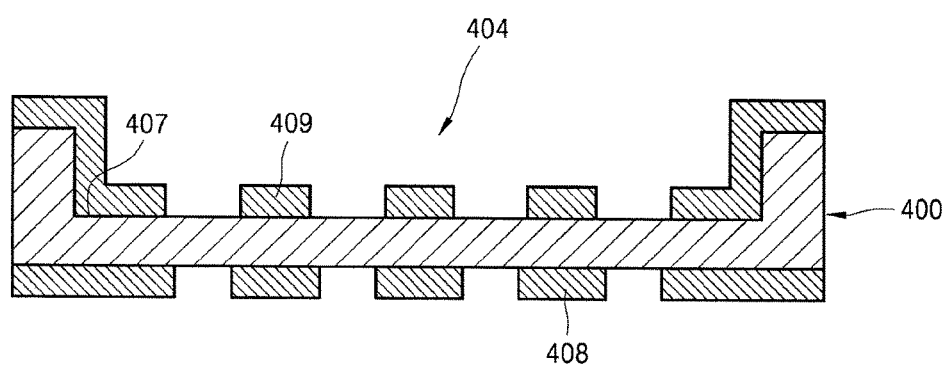

Referring to FIG. 4F, the first photosensitive layer 408 and the second photosensitive layer 409 may be exposed to light and developed. According to an embodiment, the first photosensitive layer 408 and the second photosensitive layer 409 may cover the half etching extension portion 407.

According to the present embodiment, a pattern of the deposition pattern portions may be formed using a two-step etching process in which an etching process may be performed on two sides of the mask 400.

Figure 4G:
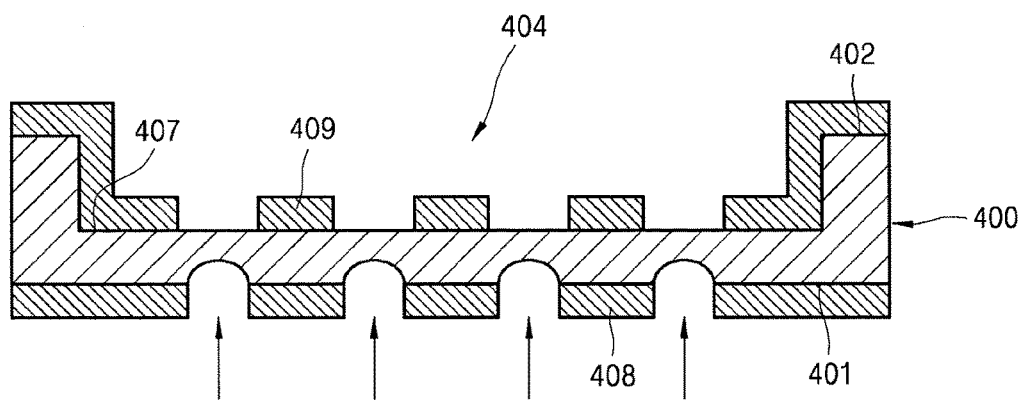

Referring to FIG. 4G, the first photosensitive layer 408 may be etched.

The first etching step may be performed on the first surface 401 of the mask 400, which may face a substrate to be deposited, e.g., to be deposited upon. In the first etching step, the mask 400 may be etched from the first surface 401 to a predetermined depth. The half etching extension portion 407 may be covered by the first photosensitive layer 408, and etching may not be performed on the half etching extension portion 407.

Figure 4H:
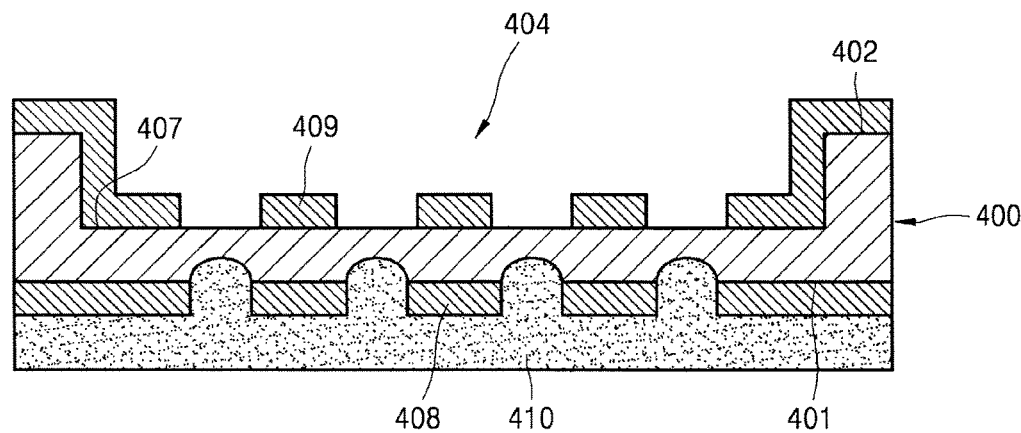

Referring to FIG. 4H, a resin 410 may be coated on the first surface 401 of the mask 400 where the first etching step may be performed. The resin 410 may cover an area of the mask 400 etched from the first surface 401. According to an embodiment, the resin 410 may be omitted.

Figure 4I:
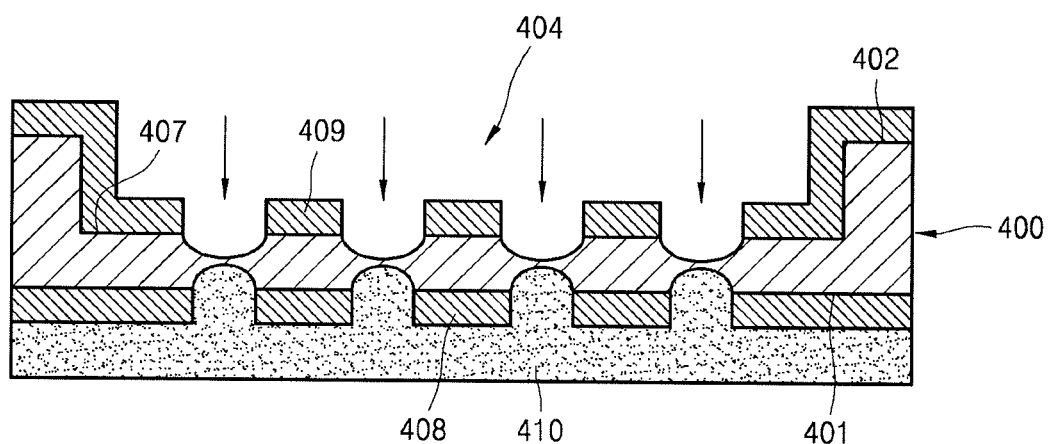

Referring to FIG. 4I, the second photosensitive layer 409 may be etched.

The second etching step may be performed on the second surface 402 of the mask 400. In the second etching step, the mask 400 may be etched from the second surface 402 to a predetermined depth. An area etched by the second etching step may be vertically in line with the area etched by the first etching step, with respect to the mask 400. The half etching extension portion 407 may be covered by the second photosensitive layer 409, and etching may not be performed on the half etching extension portion 407.

Figure 4J:
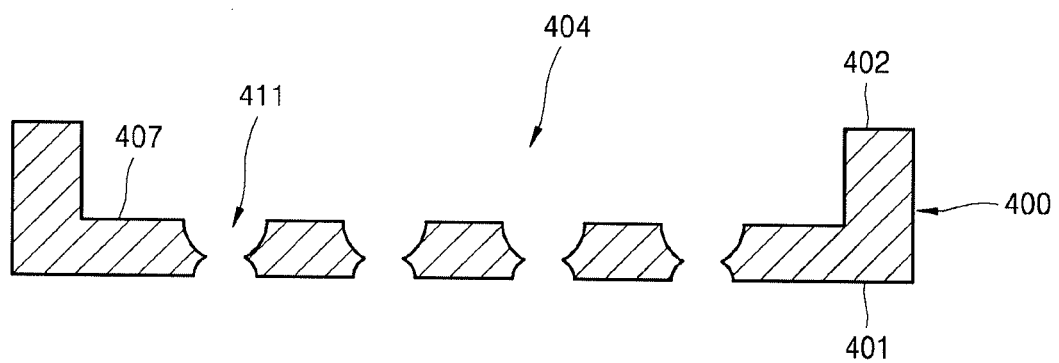

Referring to FIG. 4J, by performing the first and second steps of etching, deposition pattern portions 411 that pass through the mask 400 in a thickness direction of the mask 400 may be formed in the half-etched area 404. The deposition pattern portions 411 may be spaced apart from one another by predetermined distances in a length direction of the mask 400. As described above, by performing two-step etching on the first surface 401 and the second surface 402 of the mask 400, the deposition pattern portions 411 may be formed to have a slit shape.

The half etching extension portion 407 may be covered by the first photosensitive layer 408 and the second photosensitive layer 409 during the two-step etching, and may not pass through the mask 400.

As described above, when forming the plurality of deposition pattern portions 411 in the half-etched area 404, the half etching extension portion 407 may be formed in an outer portion of the area A where the deposition pattern portions 411 are formed, and penetration of an etching solution into an area where the deposition pattern portions 411 are formed may be prevented. Accordingly, the mask 400 having a uniform thickness and the deposition pattern portions 411 having a precise pattern may be manufactured.

FIGS. 5A through 5G sequentially illustrate a method of manufacturing a mask 500 according to an embodiment.

Figure 5A:
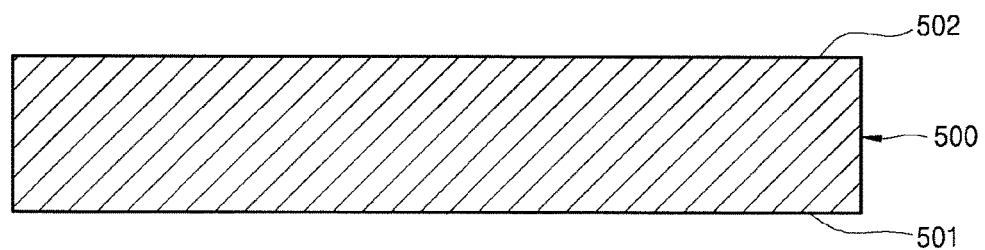
FIGS. 5A through 5G sequentially illustrate a method of manufacturing a mask according to an embodiment.

Referring to FIG. 5A, the mask 500 may be prepared. According to an embodiment, the mask 500 may be a division mask. The mask 500 may include a first surface 501 facing a substrate to be deposited, e.g., to be deposited upon, and a second surface 502 opposite to the first surface 501.

Figure 5B:
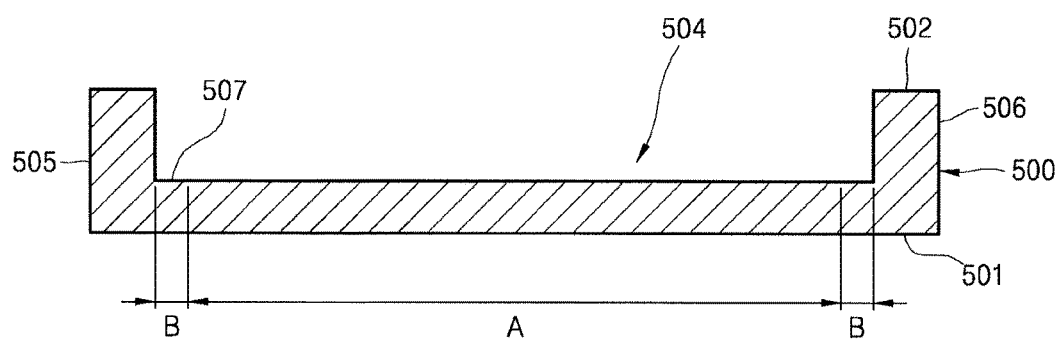

Referring to FIG. 5B, in the mask 500, a half-etched area 504 may be formed by using a photosensitive layer and by performing exposure, development, and etching on the photosensitive layer. The half-etched area 504 may be an area formed by etching the mask 500 by a thickness, e.g., a half thickness, of the mask 500. The half-etched area 504 may be formed to a predetermined depth, e.g., a depth of half the thickness of the mask 500, from the second surface 502 of the mask 500.

The half-etched area 504 may be formed between a first end 505 and a second end 506 in a length direction of the mask 500. The half-etched area 504 may be a groove formed in the length direction of the mask 500. The half-etched area 504 may not pass through the mask 500 in a thickness direction of the mask 500. The half-etched area 504 may include an area A where deposition pattern portions are formed. In the area A, a plurality of deposition pattern portions may be spaced apart from one another at predetermined distances during an etching operation.

A half etching extension portion 507 may be formed in the half-etched area 504. The half etching extension portion 507 may extend from an outer portion of the area A where a plurality of deposition pattern portions are formed to an edge B of the half-etched area 504.

Figure 5C:
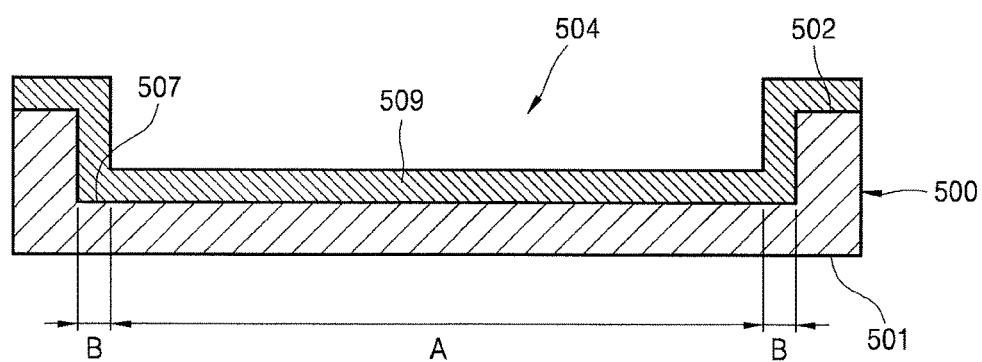

Referring to FIG. 5C, a photosensitive layer 509 may be formed on the second surface 502 of the mask 500. The photosensitive layer 509 may be a dry film register. The photosensitive layer 509 may be attached to the second surface 502 of the mask 500 by using a vacuum lamination process. The photosensitive layer 509 may cover both the area A where deposition pattern portions are formed and the edge B of the mask 500.

Figure 5D:
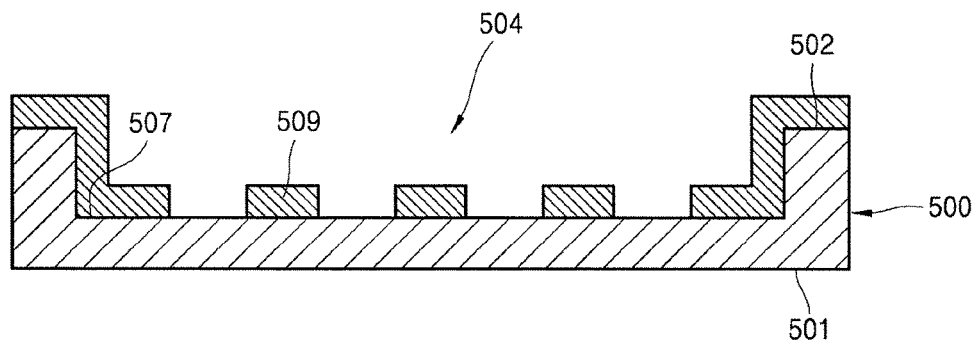

Referring to FIG. 5D, the photosensitive layer 509 may be exposed to light and developed. According to an embodiment, the photosensitive layer 509 may cover the half etching extension portion 507.

Figure 5E:
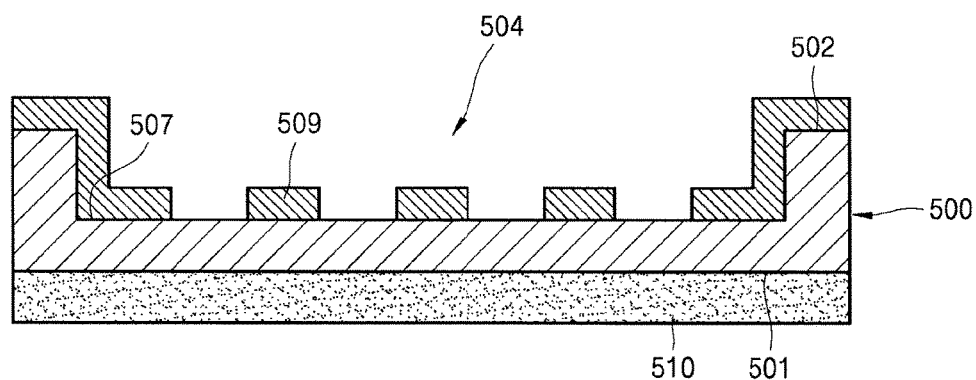

Referring to FIG. 5E, a resin 510 may be coated on the first surface 501 of the mask 500. During an etching operation, the resin 510 may protect the first surface 501 of the mask 500.

Figure 5F:
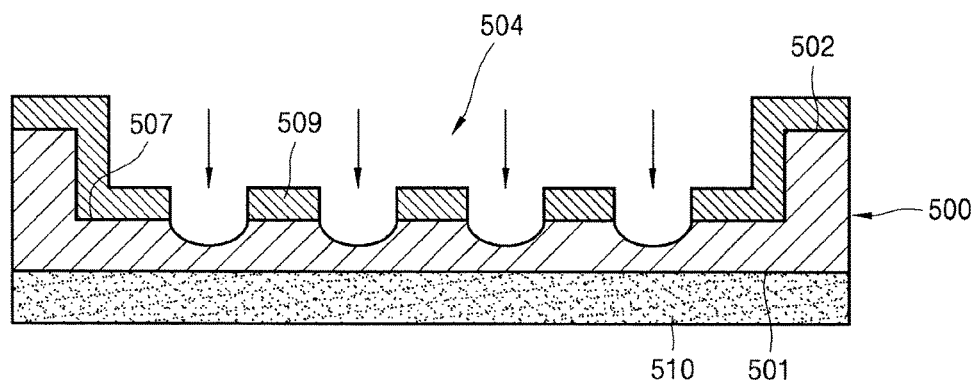

Referring to FIG. 5F, the photosensitive layer 509 may be etched. For example, only one etching step may be performed.

For example, the mask 500 may be etched from the second surface 502. The half etching extension portion 507 may cover the photosensitive layer 509, and etching may not be performed on the half etching extension portion 507.

Figure 5G:
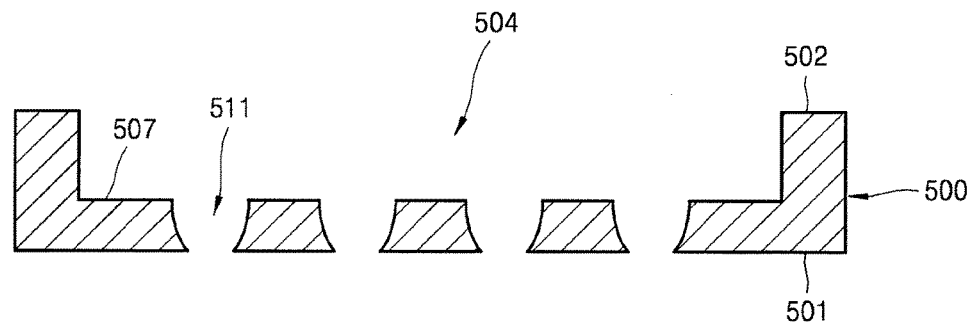

Referring to FIG. 5G, as the one-step etching operation is performed, deposition pattern portions 511 that pass through the mask 500 in a thickness direction of the mask 500 may be formed in the half-etched area 504. As described above, by performing an etching operation only once from the second surface 502 of the mask 500, the deposition pattern portions 511 may be formed to have a slit shape.

The half etching extension portion 507 may be covered during the one-step etching operation, and may not pass through the mask 500.

As described above, when forming a plurality of deposition pattern portions 511 in the half-etched area 504, as the half etching extension portion 507 is formed in an outer portion of the area A where the deposition pattern portions 511 are formed, penetration of an etching solution into the area A where the deposition pattern portions 511 are formed may be prevented.

Figure 6:
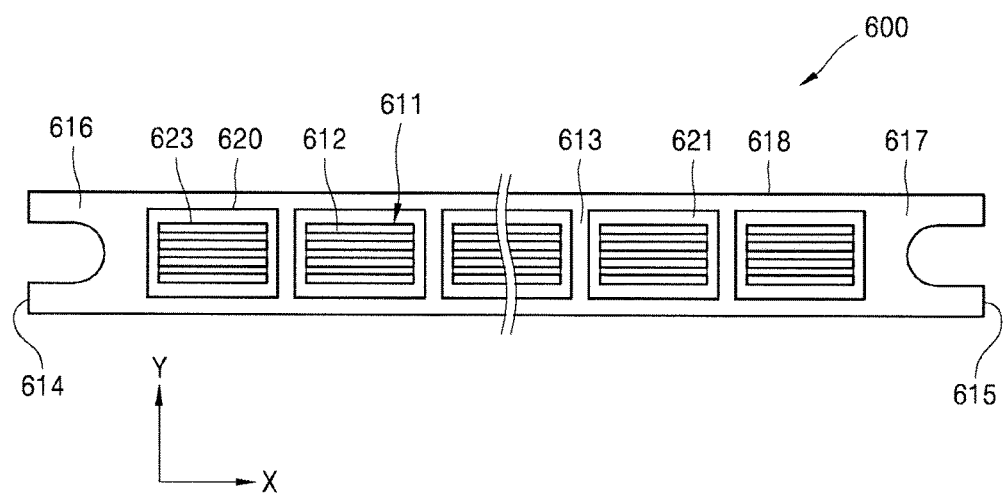
FIG. 6 illustrates a plan view of a mask according to an embodiment.

FIG. 6 illustrates a plan view of a mask 600 according to an embodiment.

Referring to FIG. 6, the mask 600 may have a first surface 601 and a second surface 602 opposite to the first surface 601. The first surface 601 may contact a substrate for deposition, e.g., a substrate to be deposited upon, which is to be patterned. According to an embodiment, the mask 600 may be a division mask.

A plurality of deposition pattern portions 611 may be formed on the mask 600. The deposition pattern portions 611 may be spaced apart from one another in a length direction of the mask 600 (X direction). Each of the deposition pattern portions 611 may include a plurality of slits 612. The slits 612 may pass through the mask 600 in a thickness direction of the mask.

A rib 613 may be formed between the adjacent deposition pattern portions 611. The rib 613 may connect adjacent deposition pattern portions 611 arranged next to each other in a length direction of the mask 600 (X direction). The rib 613 may further include a dummy deposition pattern portion (not shown). The dummy deposition pattern portion may include a slit or may be a half-etched area.

A half-etched area 620 may be formed in the mask 600.

The half-etched area 620 may be an area formed by etching the mask 600 in a thickness direction by a predetermined depth, e.g., a depth of half the thickness of the etching mask 600. The half-etched area 620 may be an area formed by etching the mask 600 by a thickness, e.g., half a thickness, of the mask 600. The half-etched area 620 may not pass through the mask 600.

The plurality of deposition pattern portions 611 may be located within the half-etched area 620. The half-etched area 620 may be formed in each area where the plurality of deposition pattern portions 611 are formed. The half-etched area 620 may be arranged at predetermined distances in a length direction of the mask 600. A plurality of half-etched areas 620 may be independently formed for each area where the deposition pattern portions 611 are formed.

A first area 616 between a first end 614 of the mask 600 and a half etching area 620 in a first outermost portion and a second area 617 between a second end 615, which is opposite to the first end 614, and a half-etched area 620 in a second outermost portion in a length direction of the mask 600 may be welded areas. The first area 616 and the second area 617 may not be half-etched.

In each of the half-etched areas 620, a half etching extension portion 621 may be formed. The half etching extension portion 621 may extend out beyond an area 623 where the deposition pattern portions 611 are formed. The half etching extension portion 621 may be an area formed by etching the mask in a thickness direction of the mask 600. Unlike the deposition pattern portions 611, the half etching extension portion 621 may not pass through the mask 600.

According to an embodiment, the rib 613 may be disposed between half etching extension portions 621 that extend from adjacent deposition pattern portions 611 in opposite directions to each other. As the rib 613 is not etched, the rib 613 may be thicker than the half etching extension portion 621.

In a width direction of the mask 600 (Y direction), an area the half etching extension portion 621 and an edge 618 of the mask 600 may not be half-etched.

Figure 7:
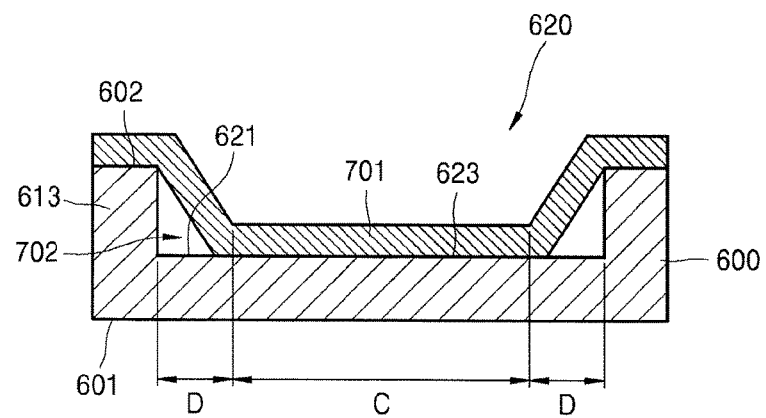
FIG. 7 illustrates a cross-sectional view of a portion of the mask of FIG. 6.

FIG. 7 illustrates a cross-sectional view of a portion of the mask 600 of FIG. 6.

According to an embodiment, the portion of the mask 600 may correspond to one of a plurality of deposition pattern portions 611 arranged in a length direction of the mask 600.

Referring to FIG. 7, the mask 600 may be etched to form the deposition pattern portions 611. When attaching a photosensitive layer 701 to the second surface 602 of the mask 600, space 702 where the photosensitive layer 701 may not be properly attached may be generated at an edge B of the half-etched area 620.

According to the present embodiment, in the mask 600, a half etching extension portion 621 may be formed in an outer portion of an area C where a plurality of deposition pattern portions are formed. The half etching extension portion 621 may extend from an outer portion of the area C where deposition pattern portions are formed to an edge D of the half-etched area 620.

Even if the space 702 is formed as the photosensitive layer 701 is properly attached to the mask 600, the space 702 may be disposed in the half etching extension portion 621. In the area C where a plurality of deposition pattern portions are formed, the photosensitive layer 701 may completely contact the second surface 602 of the mask 600, and an etching solution may not penetrate into the area C where a plurality of deposition pattern portions are formed.

Figure 8:
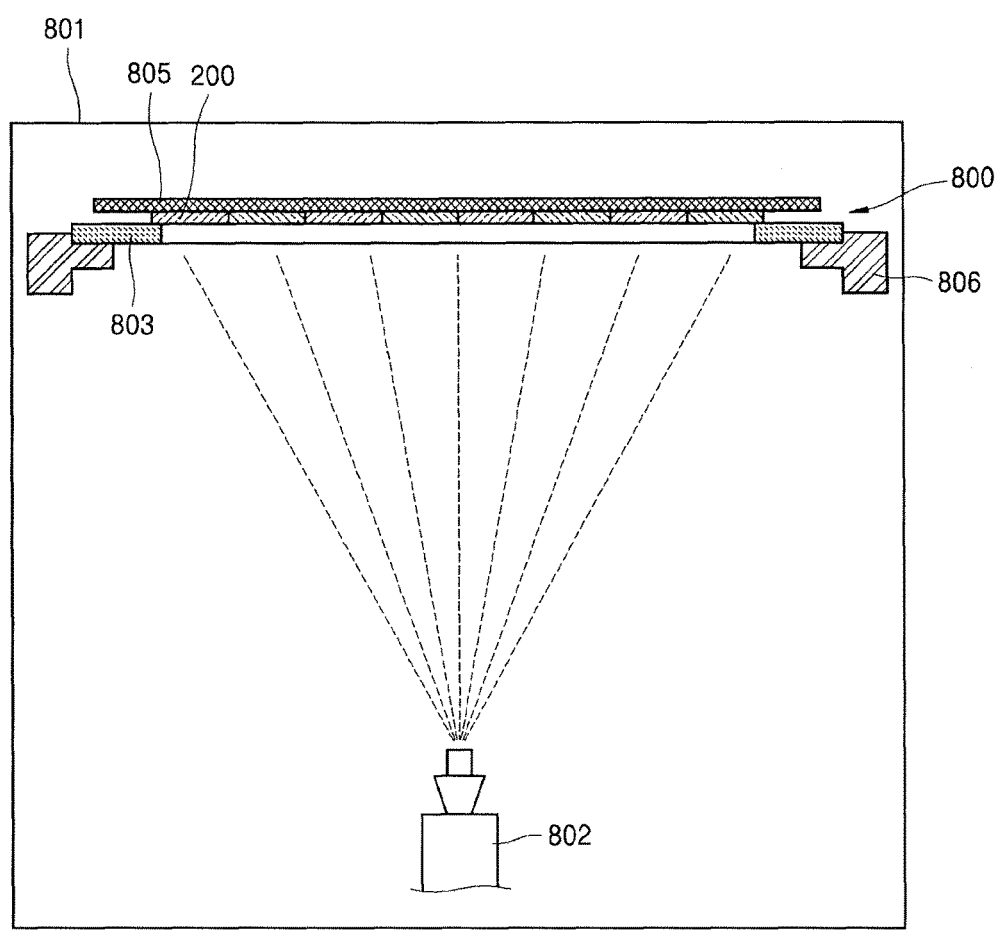
FIG. 8 illustrates a structural diagram of deposition of a thin film on a substrate by using a mask assembly according to an embodiment.

FIG. 8 illustrates a structural diagram of deposition of a thin film on a substrate by using a mask assembly 800 according to an embodiment.

Referring to FIG. 8, a vacuum chamber 801 may be prepared using the mask assembly 800 to deposit an organic emissive layer or an electrode of an organic light emitting display apparatus.

A deposition source 802 may be disposed under the vacuum chamber 801, and the mask assembly 800 may be installed above the deposition source 802. The mask assembly 800 may include the division mask 200 illustrated in FIG. 2. The division mask 200 may include at least one division mask. The division mask 200 may be disposed on a mask frame 803. A substrate 805 for deposition, e.g., a substrate 805 to be deposited upon, may be disposed on the division mask 200. An additional supporting member 806 that fixes the mask assembly 800 may be further included at an edge of the mask assembly 800.

Hereinafter, how a deposition material is deposited on the substrate 805 will be described briefly.

First, the mask assembly 800 may be fixed to the supporting member 806, and the substrate 805 for deposition, e.g., the substrate 805 to be deposited upon, may be located on the division mask 200.

Next, by spraying a deposition material from the deposition source 802 disposed under the vacuum chamber 801 onto the mask assembly 800, the deposition material may be deposited on a surface of the substrate 805, for example, due to the deposition pattern portions 211 (see FIG. 2) formed on the division mask 200.

Figure 9:
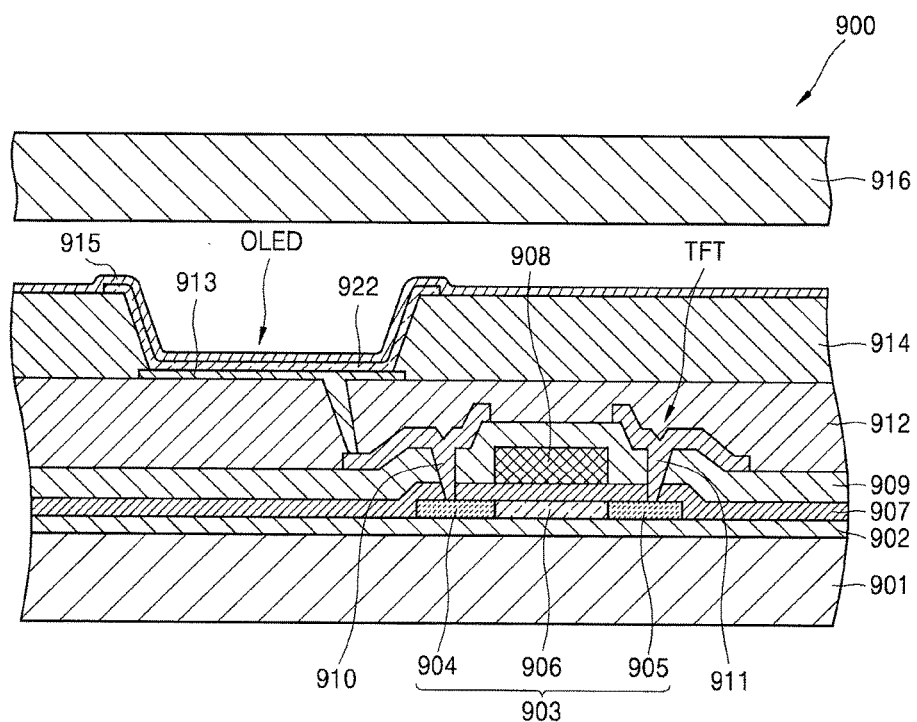
FIG. 9 illustrates a cross-sectional view of a sub-pixel of an organic light emitting display apparatus according to an embodiment.

FIG. 9 illustrates a cross-sectional view of a sub-pixel of an organic light emitting display apparatus 900, which may be formed by deposition performed by using the mask 200, according to an embodiment.

Referring to FIG. 9, the organic light emitting display apparatus 900 may include a display substrate 901. The display substrate 901 may be formed of a flexible insulation material or an insulation material having rigidity. The display substrate 901 may be transparent, semi-transparent or opaque.

A barrier layer 902 may be formed on the display substrate 901. The barrier layer 902 may cover the entire upper surface of the display substrate 901. The barrier layer 902 may include an inorganic layer or an organic layer.

A thin film transistor (TFT) may be formed on the barrier layer 902. A semiconductor active layer 903 may be formed on the barrier layer 902. A source area 904 and a drain area 905 may be formed on the semiconductor active layer 903 by doping with an N-type impurity ion or a P-type impurity ion. An area between the source area 904 and the drain area 905 may be a channel area 906 which may not be doped with an impurity.

A gate insulation layer 907 may be deposited on the semiconductor active layer 903. The gate insulation layer 907 may include an inorganic layer such as a silicon oxide, a silicon nitride or a metal oxide. The gate insulation layer 907 may be a single layer or a multi-layer.

A gate electrode 908 may be formed on a predetermined area of the gate insulation layer 907. The gate electrode 908 may include a single layer or a multi-layer formed of, for example, Au, Ag, Cu, Ni, Pt, Pd, Al, Mo, or Cr. The gate electrode 908 may include an alloy such as Al:Nd or Mo:W.

An interlayer insulation layer 909 may be formed on the gate electrode 908. The interlayer insulation layer 909 may include an inorganic layer such as a silicon oxide or a silicon nitride, or an organic layer.

A source electrode 910 and a drain electrode 911 may be formed on the interlayer insulation layer 909. For example, a contact hole may be formed in the gate insulation layer 907 and the interlayer insulation layer 909 by selectively removing portions thereof, and the source electrode 910 may be electrically connected to the source area 904 and the drain electrode 911 may be electrically connected to the drain area 905 through the hole.

A protection layer 912 such as a passivation layer and/or a planarization layer may be formed on the source electrode 910 and the drain electrode 911. The protection layer 912 may include an inorganic layer such as a silicon oxide or a silicon nitride or an organic layer such as acryl, polyimide, or benzocyclobutene (BCB).

An organic light emitting device (OLED) may be formed on the TFT.

The OLED may be formed on the protection layer 912. The OLED may include a first electrode 913, an intermediate layer 922 including an organic emissive layer, and a second electrode 915.

A pixel defining layer 914 may cover the protection layer 912 and a portion of the first electrode 913. The pixel defining layer 914 may be formed of an organic layer or an inorganic layer. The pixel defining layer 914 may be formed of a single layer or a multi-layer.

Holes and electrons respectively injected from the first electrode 913 and the second electrode 915 of the OLED may combine in the organic emissive layer of the intermediate layer 922, and light may be emitted.

The intermediate layer 922 may include the organic emissive layer. According to an embodiment, the intermediate layer 922 may further include, in addition to the organic emissive layer, at least one of a hole injection layer (HIL), a hole transport layer (HTL), an electron transport layer (ETL), and an electron injection layer (EIL). In an embodiment, and the intermediate layer 922 may include an organic emissive layer and also other various functional layers.

The second electrode 915 may be formed on the intermediate layer 922. The second electrode 915 may generates an electrical field with the first electrode 913, and light may be emitted from the intermediate layer 922. The first electrode 913 may be patterned in each pixel, and the second electrode 913 may be formed so as to apply a common voltage to all pixels.

The first electrode 913 and the second electrode 915 may include a transparent electrode or a reflective electrode.

The first electrode 913 may function as an anode and may be formed of various conductive materials. While the first electrode 913 may be a transparent electrode, it may also be formed of a reflective electrode. The second electrode 915 may function as a cathode. Like the first electrode 913, the second electrode 915 may be formed of a transparent electrode or a reflective electrode.

An encapsulation substrate 916 may be formed above the OLED. The encapsulation substrate 916 may be formed to help protect the intermediate layer 922 and other thin layers from, for example, external moisture or oxygen.

The encapsulation substrate 916 may be a rigid glass, a polymer resin, or a flexible film. The encapsulation substrate 916 may be formed by alternately stacking an organic layer and an inorganic layer above the OLED. A plurality of organic layers and a plurality of inorganic layers may be used here.

By way of summation and review, a patterned thin film may be formed in an organic light emitting display apparatus by using a deposition operation. A patterned thin film may be formed by locating on a substrate a mask having the same pattern as that of the patterned thin film to be formed on the substrate and then depositing a raw material of the thin film, on the substrate.

One or more exemplary embodiments include a mask assembly for thin film deposition, and a method of manufacturing the mask assembly.

As described above, according to the one or more of the above exemplary embodiments, a mask having a uniform thickness may be manufactured, and a thin film having a desired pattern may be formed on a substrate.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask assembly for thin film deposition, the mask assembly comprising:
   a mask frame having an opening;
   a mask coupled to the mask frame and having a first surface facing a substrate and a second surface opposite to the first surface, a plurality of deposition pattern portions including a plurality of slits passing through the mask, and a rib between adjacent deposition pattern portions, the mask having a partially etched area having a thickness that is less than a thickness of peripheral areas of the mask, the plurality of deposition pattern portions being within the partially etched area such that the plurality of deposition pattern portions have the thickness that is less than the thickness of the peripheral areas of the mask; and
   a partial etching extension portion in an outer portion of an area where the plurality of deposition pattern portions are formed such that the area where the plurality of deposition pattern portions are formed is continuously surrounded by the partial etching extension portion,
   wherein a thickness of the area where the plurality of deposition pattern portions are formed is the same as a thickness of the partial etching extension portion, the thickness of the mask at the area where the plurality of deposition pattern portions are formed being a distance in a direction that the slits pass through the mask from the first surface of the mask to the second surface of the mask.

2. The mask assembly as claimed in claim 1, wherein the partial etching extension portion is located only in an area of the mask etched without passing through the mask.

3. The mask assembly as claimed in claim 2, wherein:
   the deposition pattern portions are spaced apart from one another in a length direction of the mask, and
   the partially etched area extends from a first end of the mask to a second end of the mask, the second end of the mask is opposite to the first end of the mask in the length direction of the mask.

4. The mask assembly as claimed in claim 3, wherein the partial etching extension portion extends from the outer portion of the area where the plurality of deposition pattern portions are formed to an edge of the partially etched area.

5. The mask assembly as claimed in claim 2, wherein:
   the deposition pattern portions are spaced apart from one another in a length direction of the mask, and
   the partially etched area is independently formed for each area where the plurality of deposition pattern portions are formed.

6. The mask assembly as claimed in claim 5, wherein the partial etching extension portion extends from each outer portion of the area where the plurality of deposition pattern portions are formed to an edge of each of the partially etched areas.

7. The mask assembly as claimed in claim 6, wherein:
   the rib between the adjacent deposition pattern portions connects the adjacent deposition pattern portions, and
   the rib is between partial etching extension portions that extend from adjacent deposition pattern portions in opposite directions to each other.

8. The mask assembly as claimed in claim 7, wherein the rib is thicker than the partial etching extension portion.

9. The mask assembly as claimed in claim 1, wherein the partially etched area is an area formed by etching the mask from the second surface to the first surface of the mask so that the partially etched area has the thickness that is less than the thickness of the peripheral areas of the mask.

10. The mask assembly as claimed in claim 9, wherein the first surface contacts the substrate for deposition, to be patterned.

11. The mask assembly as claimed in claim 1, wherein the mask is at least one division mask.

* * * * *